US011581860B2

(12) United States Patent
Kim et al.

(10) Patent No.: US 11,581,860 B2
(45) Date of Patent: Feb. 14, 2023

(54) APPARATUS AND METHOD FOR CANCELING RECEIVER INPUT OFFSET IN DISTANCE SENSING SYSTEM

(71) Applicant: HYUNDAI MOBIS CO., LTD., Seoul (KR)

(72) Inventors: Yoon Ji Kim, Seoul (KR); Hee Hyun Lee, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 274 days.

(21) Appl. No.: 17/106,412

(22) Filed: Nov. 30, 2020

(65) Prior Publication Data

US 2021/0203290 A1 Jul. 1, 2021

(30) Foreign Application Priority Data

Dec. 30, 2019 (KR) .................. 10-2019-0178687
May 28, 2020 (KR) .................. 10-2020-0064541

(51) Int. Cl.
  *H03F 3/45* (2006.01)
  *H03M 1/66* (2006.01)

(52) U.S. Cl.
  CPC .......... *H03F 3/45076* (2013.01); *H03M 1/66* (2013.01); *H03F 2200/375* (2013.01); *H03F 2200/451* (2013.01)

(58) Field of Classification Search
  CPC .......... H03F 3/45076; H03F 2200/375; H03F 2200/451; H03F 3/195; H03F 3/45968;
  (Continued)

(56) References Cited

U.S. PATENT DOCUMENTS 6,710,645 B2 * 3/2004 Isken ................. H03F 3/45605
  330/9
7,352,307 B2 * 4/2008 Iorgulescu ......... H03M 1/1019
  341/120
(Continued)

FOREIGN PATENT DOCUMENTS

JP 2003-264437 A 9/2003
JP 2008-211702 A 9/2008
(Continued)

OTHER PUBLICATIONS

Notice of Allowance issued in corresponding Korean Patent Application No. 10-2020-0064541 dated Jun. 13, 2022 with English translation.
(Continued)

*Primary Examiner* — Khanh V Nguyen
(74) *Attorney, Agent, or Firm* — Morgan, Lewis & Bockius LLP

(57) ABSTRACT

An apparatus for canceling an input offset of a receiver including a differential amplification unit and a differential comparison unit in a distance sensing system includes: an output monitoring unit selectively monitoring differential outputs of the differential comparison unit and the differential amplification unit; a current type digital-analog conversion unit connected to each of an input terminal of the differential comparison unit and the input terminal of the differential amplification unit; and a control unit controlling the current type digital-analog conversion unit to reduce a difference in differential output of the differential comparison unit according to a comparison result for the difference of the monitored differential output of the differential comparison unit and controlling the current type digital-analog conversion unit to reduce the difference in differential output of the differential amplification unit according to the com-
(Continued)

parison result for the difference of the monitored differential output of the differential amplification unit.

18 Claims, 17 Drawing Sheets

(58) Field of Classification Search
CPC ..... H03F 3/45475; H03M 1/66; H03M 1/742; G01S 7/486; G01S 7/497; G01S 17/08
USPC .................................................. 330/253, 259
See application file for complete search history.

(56) References Cited

U.S. PATENT DOCUMENTS

| | | | |
|---|---|---|---|
| 7,453,306 B2 * | 11/2008 | Baumgartner | ........... H03K 5/06 327/563 |
| 2014/0232464 A1 * | 8/2014 | Song | ................... H03F 3/45179 330/258 |
| 2014/0266487 A1 | 9/2014 | Vaishnav | |

FOREIGN PATENT DOCUMENTS

| | | |
|---|---|---|
| JP | 2017-034624 A | 2/2017 |
| JP | 2019-176459 A | 10/2019 |
| KR | 10-2009-0045774 A | 5/2009 |
| KR | 10-2010-0034977 A | 4/2010 |
| KR | 10-2015-0081118 A | 7/2015 |
| KR | 10-1924906 B1 | 2/2019 |
| WO | 03/081769 A2 | 10/2003 |

OTHER PUBLICATIONS

Office Action issued in corresponding Korean Patent Application No. 10-2020-0064541 dated Nov. 11, 2021.

* cited by examiner

APPARATUS AND METHOD FOR CANCELING RECEIVER INPUT OFFSET IN DISTANCE SENSING SYSTEM

CROSS-REFERENCE TO RELATED APPLICATIONS

This application claims priority to and the benefit of Korean Patent Application No. 10-2019-0178687, filed on Dec. 30, 2019, and Korean Patent Application No. 10-2020-0064541 filed on May 28, 2020, the entire contents of which are incorporated herein by reference.

FIELD

The present disclosure relates to an apparatus and a method for canceling a receiver input offset in a distance sensing system, and more particularly, to an apparatus and a method for canceling a receiver input offset in a distance sensing system, which cancels an input offset of a receiver.

BACKGROUND

The statements in this section merely provide background information related to the present disclosure and may not constitute prior art.

Light detection and ranging (LIDAR) is a technology that measures a distance by using light and senses an object. The LIDAR represents measuring physical properties including a distance and concentration, a speed, a shape, and the like of an object to be measured from radiation of a laser up to a return time of a scattered or reflected laser and an intensity of the laser, a change in frequency, a change in polarization state, etc.

The LIDAR is similar to radio detection and ranging (RADAR) that acquires the distance by observing a reciprocating time up to a target by using a microwave, but is different from the RADAR in that the LIDAR uses the light unlike the RADAR using radio waves and in this respect, the LIDAR is also referred to as an 'image radar'.

The LIDAR was first developed for weather observation in the 1930s and began to be utilized in earnest in the 1960s when laser technology emerged. At that time, the LIDAR was mainly applied to an aviation field and satellites, but an application area of the LIDAR has since expanded and the LIDAR has been applied to a global environment, exploration, automobiles, and robots. Aviation LIDAR has become a mainstream of a LIDAR device, in which a satellite or aircraft emits a laser pulse and a ground observatory receives pulses rear-scattered by particles in the atmosphere and the aviation LIDAR has been used for measuring presence and movement of dust, smoke, aerosols, cloud particles, etc., with wind information and analyzing a distribution of dust particles in the atmosphere or an atmospheric pollution level.

In recent years, a ground LIDAR having both transmitting and receiving systems which are installed on the ground to perform obstacle detection, terrain modeling, and a location acquisition function up to a target is also actively researched by considering application of the ground LIDAR to military defense fields such as surveillance reconnaissance robots, combat robots, unmanned aerial ships, and unmanned helicopters or civil fields such as civil transport robots, intelligent vehicles, and unmanned vehicles.

However, an input sensor used in the LIDAR system sends a current output to a photodiode. In order to sense the current output as a distance signal, the LIDAR system processes a signal by converting/amplifying current into voltage. In this case, most amplifiers adopt a differential structure for noise removal and accuracy increase. We have discovered that the amplifier basically has common mode voltage and when an offset occurs in the voltage, an error may occur in generating data after a receiver.

SUMMARY

The present disclosure provides an apparatus and a method for canceling a receiver input offset in a distance sensing system, which cancel an input offset of a receiver by reducing a monitored differential output difference of the receiver through a current type digital-analog converter to increase a distance of object sensing.

The present disclosure also provides an apparatus and a method for canceling a receiver input offset in a distance sensing system, which cancel an input offset of a receiver in the distance sensing system to increase accuracy of distance sensing.

However, it is to be understood that the technical problem to be solved by the present disclosure is not limited to the above problems and may be variously extended in an environment of a range which departs from the spirit and area of the present disclosure.

An exemplary form of the present disclosure provides an apparatus for canceling an input offset of a receiver including a differential amplification unit and a differential comparison unit in a distance sensing system, which includes: an output monitoring unit selectively monitoring differential outputs of the differential comparison unit and the differential amplification unit; a current type digital-analog conversion unit connected to each of an input terminal of the differential comparison unit and the input terminal of the differential amplification unit; and a control unit controlling the current type digital-analog conversion unit to reduce a difference in differential output of the differential comparison unit according to a comparison result for the difference of the monitored differential output of the differential comparison unit and controlling the current type digital-analog conversion unit to reduce the difference in differential output of the differential amplification unit according to the comparison result for the difference of the monitored differential output of the differential amplification unit.

The output monitoring unit may include a multiplexer connected to each of an output terminal of the differential comparison unit and the output terminal of the differential amplification unit and selecting and transferring the differential output of the differential comparison unit or the differential output of the differential amplification unit, a buffer buffering the transferred differential output, and an analog-digital converter converting the buffered differential output by an analog-digital scheme.

The current type digital-analog conversion unit may include a first current type digital-analog conversion unit connected to the input terminal of the differential comparison unit, and a second current type digital-analog conversion unit connected to the input terminal of the differential amplification unit.

When the difference of the differential output of the differential comparison unit is less than a predetermined minimum offset, the control unit may fix a control bit of the first current type digital-analog converter.

The control unit changes a first control bit for controlling reference current of the first current type digital-analog conversion unit to reduce the difference of the differential output of the differential comparison unit.

The control unit may change a second control bit for controlling an amount of current output as an output of the first current type digital-analog conversion unit.

The control unit changes a first control bit for controlling the reference current of the second current type digital-analog conversion unit to reduce the difference of the differential output of the differential amplification unit.

The control unit may change a second control bit for controlling an amount of current output as the output of the second current type digital-analog conversion unit.

The apparatus may further include a slope control unit setting a slope from coarse to fine for each current type digital-analog conversion unit.

Another exemplary form of the present disclosure provides a method for canceling an input offset of a receiver including a differential amplification unit and a differential comparison unit in a distance sensing system, which includes: monitoring a differential output of the differential comparison unit; controlling a first current type digital-analog conversion unit connected to an input of the differential comparison unit to reduce a difference in differential output of the differential comparison unit according to a comparison result for the difference of the monitored differential output of the differential comparison unit; monitoring the differential output of the differential amplification unit; and controlling a second current type digital-analog conversion unit connected to the input of the differential amplification unit to reduce the difference in differential output of the differential amplification unit according to the comparison result for the difference of the monitored differential output of the differential amplification unit.

The monitoring of the differential output of the differential comparison unit may include selecting and transferring the differential output of the differential comparison unit, buffering the transferred differential output, and converting the buffered differential output by an analog-digital scheme.

The monitoring of the differential output of the differential amplification unit may include selecting and transferring the differential output of the differential amplification unit, buffering the transferred differential output, and converting the buffered differential output by the analog-digital scheme.

The method may further include when the difference of the differential output of the differential comparison unit is less than a predetermined minimum offset, fixing a control bit of the first current type digital-analog converter.

In the reducing of the difference of the differential output of the differential comparison unit, a first control bit for controlling reference current of the first current type digital-analog conversion unit is changed to reduce the difference of the differential output of the differential comparison unit.

In the reducing of the difference of the differential output of the differential comparison unit, a second control bit for controlling an amount of current output as an output of the first current type digital-analog conversion unit may be changed.

In the reducing of the difference of the differential output of the differential amplification unit, a first control bit for controlling reference current of the second current type digital-analog conversion unit is changed to reduce the difference of the differential output of the differential amplification unit.

In the reducing of the difference of the differential output of the differential amplification unit, a second control bit for controlling an amount of current output as the output of the second current type digital-analog conversion unit may be changed.

The method may further include setting a slope from coarse to fine for each current type digital-analog conversion unit.

The disclosed technology may have the following effects. However, since it is not meant that a particular form should include all of the following effects or merely include the following effects, it should be understood that the scope of the disclosed technology is not to be construed as being limited thereby.

According to exemplary forms of the present disclosure, an input offset of a receiver is cancelled by reducing a differential output difference of the receiver monitored in a distance sensing system through a current type digital-analog converter to increase a distance of object sensing.

According to exemplary forms of the present disclosure, an input offset of a receiver in the distance sensing system is cancelled to increase accuracy of distance sensing.

According to exemplary forms of the present disclosure, significant technical improvement may be enabled in distance sensing of a LIDAR semiconductor. In sensing a distance, a significant gain is desired for signal processing by receiving a current signal as an input. When exemplary forms of the present disclosure are applied, a range of a gain which may be utilized in the distance sensing system is widened. This may become one of methods for increasing the distance of object sensing.

According to exemplary forms of the present disclosure, an error of data delivered to a logic through a comparator is reduced to increase accuracy of the data.

The foregoing summary is illustrative only and is not intended to be in any way limiting. In addition to the illustrative aspects, forms, and features described above, further aspects, forms, and features will become apparent by reference to the drawings and the following detailed description.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
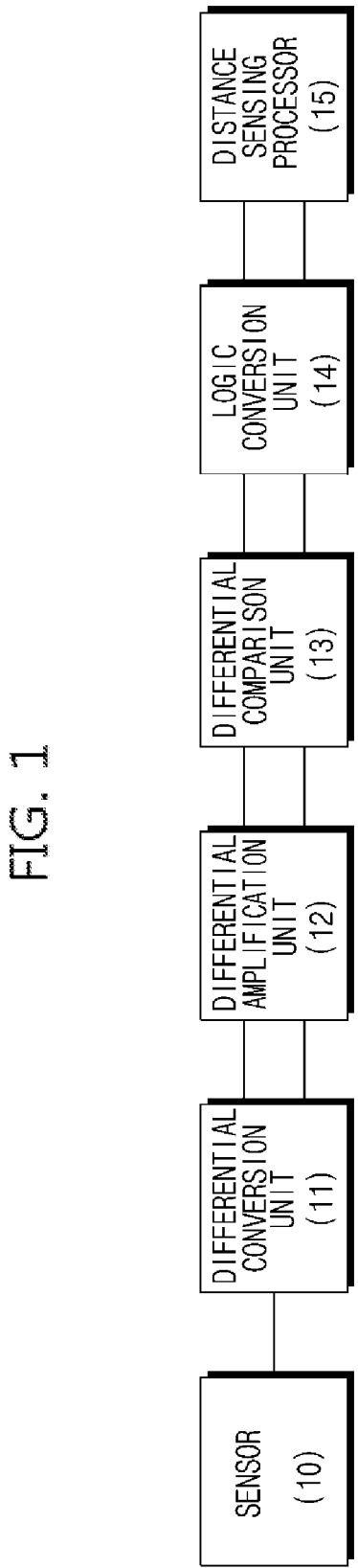
FIG. 1 is a configuration diagram illustrating a distance receiver in a general distance sensing system.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The present disclosure may have various modifications and various exemplary forms and specific exemplary forms will be illustrated in the drawings and described in detail.

It should be understood that the appended drawings are not necessarily to scale, presenting a somewhat simplified representation of various features illustrative of the basic principles of the present disclosure. The specific design features of the present disclosure as disclosed herein, including, for example, specific dimensions, orientations, locations, and shapes will be determined in part by the particular intended application and use environment.

However, this does not limit the present disclosure to specific exemplary forms, and it should be understood that the present disclosure covers all the modifications, equivalents and replacements included within the idea and technical scope of the present disclosure.

Terms including as first, second, and the like are used for describing various components, but the components not limited by the terms. The terms are used only to discriminate one component from another component. For example, a first component may be referred to as a second component, and similarly, the second component may be referred to as the first component without departing from the scope of the present disclosure. A term 'and/or' includes a combination of a plurality of associated disclosed items or any item of the plurality of associated disclosed items.

It should be understood that, when it is described that a component is "connected to" or "accesses" another component, the component may be directly connected to or access the other component or a third component may be present therebetween. In contrast, it should be understood that, when it is described that a component is "directly connected to" or "directly accesses" another component, it is understood that no element is present between the element and another element.

Terms used in the present application are used only to describe specific exemplary forms, and are not intended to limit the present disclosure. A singular form may include a plural form if there is no clearly opposite meaning in the context. In the present application, it should be understood that the term "include" or "have" indicates that a feature, a number, a step, an operation, a component, a part or the combination thereof described in the specification is present, but does not exclude a possibility of presence or addition of one or more other features, numbers, steps, operations, components, parts or combinations thereof, in advance.

Also, the terms, such as 'unit' or 'module', etc., should be understood as a unit that processes at least one function or operation and that may be embodied in a hardware manner (e.g., a processor), a software manner, or a combination of the hardware manner and the software manner.

If not contrarily defined, all terms used herein including technological or scientific terms have the same meanings as those generally understood by a person with ordinary skill in the art. Terms which are defined in a generally used dictionary should be interpreted to have the same meaning as the meaning in the context of the related art, and are not interpreted as an ideal meaning or excessively formal meanings unless clearly defined in the present application.

Hereinafter, exemplary forms of the present disclosure will be described in more detail with reference to the accompanying drawings. In describing the present disclosure, the same reference numerals are used for the same components in the drawings and a duplicated description of the same components will be omitted for facilitating overall understanding of the present disclosure.

FIG. 1 is a configuration diagram illustrating a distance receiver in a general distance sensing system.

As illustrated in FIG. 1, the general distance sensing system includes a sensor 10, a differential conversion unit 11, a differential amplification unit 12, a differential comparison unit 13, a logic conversion unit 14, and a distance sensing processor 15.

The sensor 10 recognizes a signal reflected on and returned from an object as an electric signal.

The differential conversion unit 11 converts an output signal of the sensor 10 into a differential signal for signal processing.

The differential amplification unit 12 amplifies the differential signal into a signal sensible by the differential comparison unit 13.

The differential comparison unit 13 compares an input signal with reference voltage and outputs the input signal in a pulse form.

The logic conversion unit 14 converts a differential output into a single output.

The distance sensing processor 15 calculates a value of time of flight (ToF) by comparing a Start signal and a Stop signal.

Figure 2:
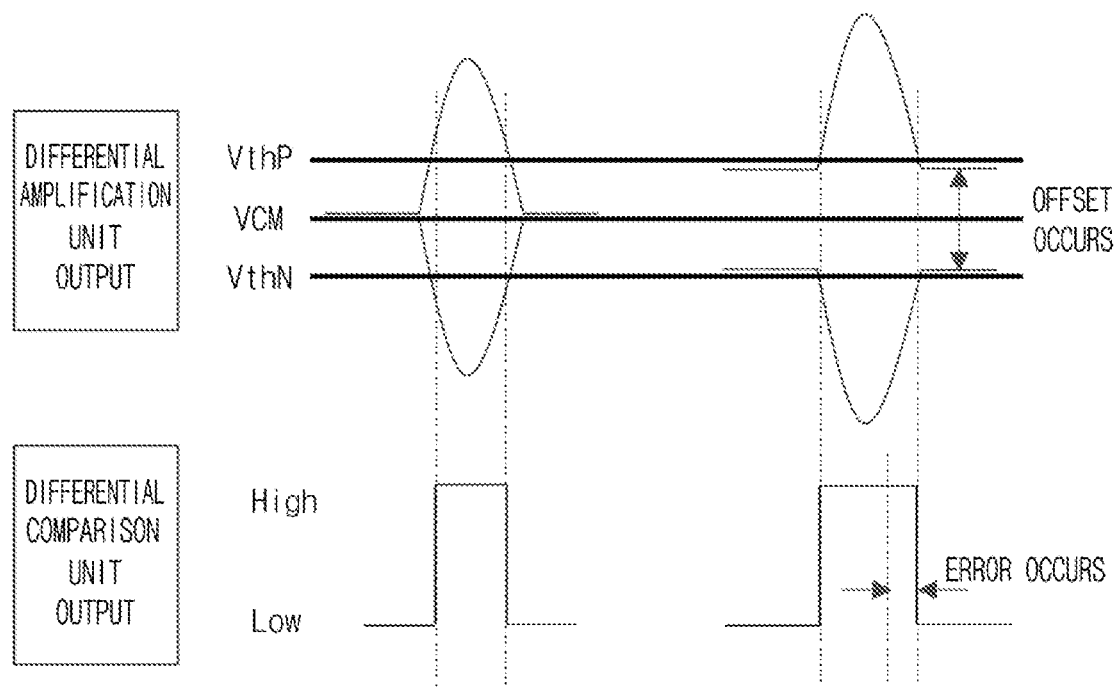
FIG. 2 is a diagram illustrating an error by offset occurrence of the distance receiver in the general distance sensing system.

FIG. 2 is a diagram illustrating an error by offset occurrence of the distance receiver in the general distance sensing system.

As illustrated in FIG. 2, when an offset occurs in an output of a differential amplification unit, an error occurs in the output of the differential comparison unit.

In the general distance sensing system (e.g., LIDAR system), when an error of 10 ns occurs in a ToF result, a distance sensing error of 1.5 m occurs as shown in [Equation 1] below.

$$10 \text{ ns}/2 \times 3 \times 10^8 \text{ m/s} = 1.5 \text{ m} \qquad \text{[Equation 1]}$$

An exemplary form of the present disclosure is to reduce an error rate of the signal processing by canceling an offset which may occur at a differential input terminal in the differential amplification unit and the differential comparison unit.

In an exemplary form of the present disclosure, when the offset is cancelled, a gain as much may be used and a measurement distance may be increased.

Figure 3:
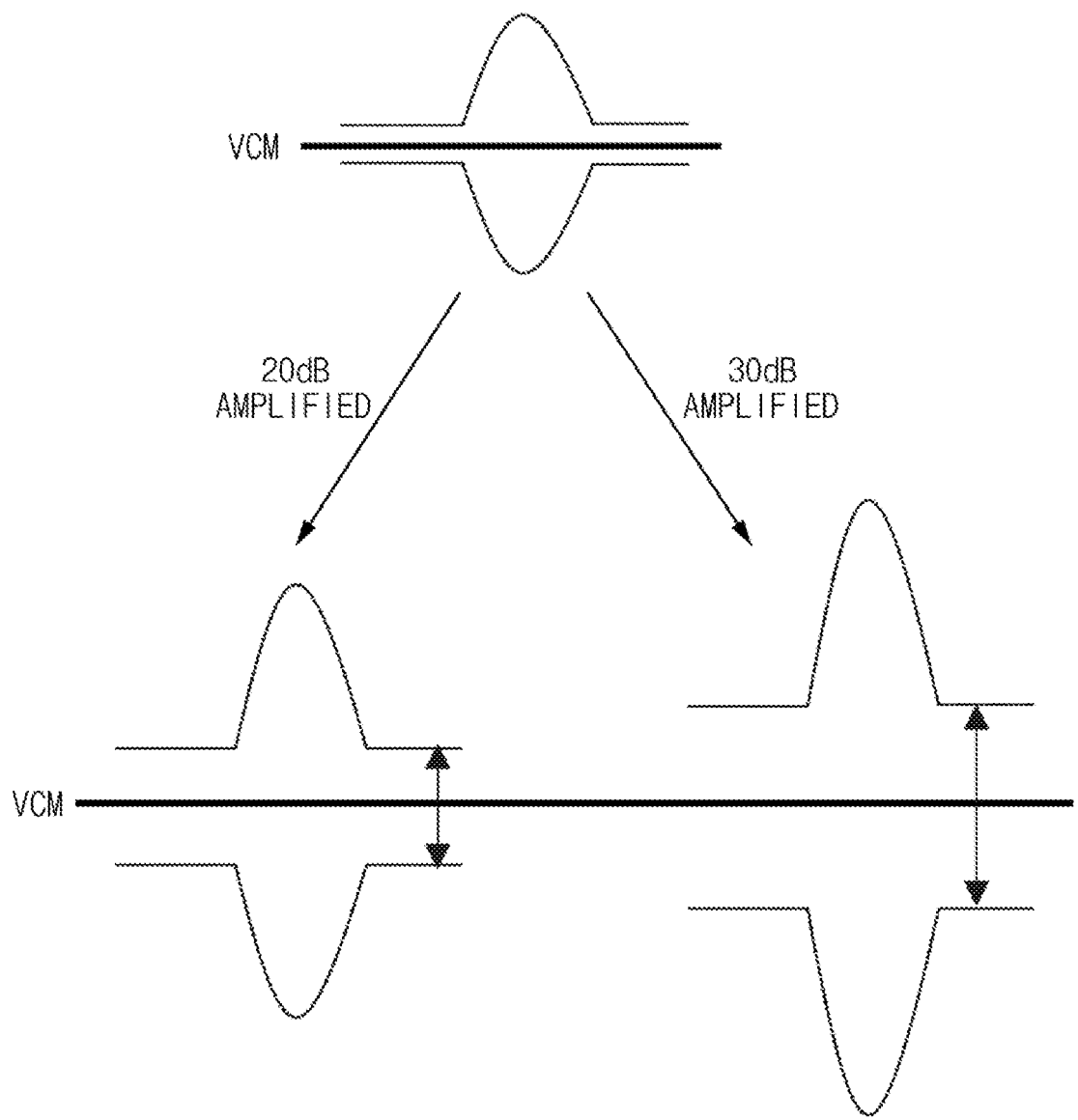
FIG. 3 is a diagram illustrating an offset change depending on a gain.

FIG. 3 is a diagram illustrating an offset change depending on a gain.

As illustrated in FIG. 3, an input signal is amplified according to the gain and a DC level is also amplified as much as the gain. Accordingly, a degree of the offset varies depending on the gain. For example, it can be seen that the degree of the offset is different in a case where a differential signal having common mode voltage (VCM) is amplified by 20 dB and in a case where the differential signal is amplified by 30 dB.

Figure 4A:
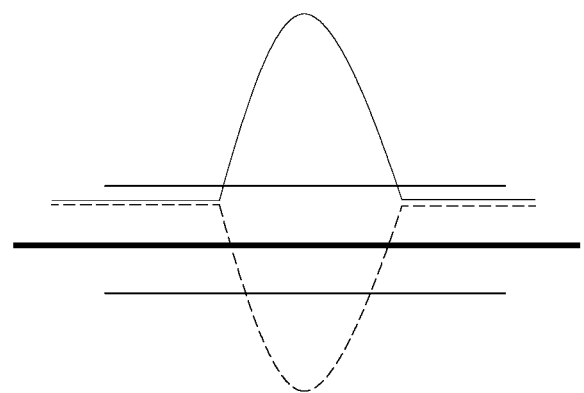
FIGS. 4A and 4B are diagrams illustrating direct current offset calibration.
Figure 4B:
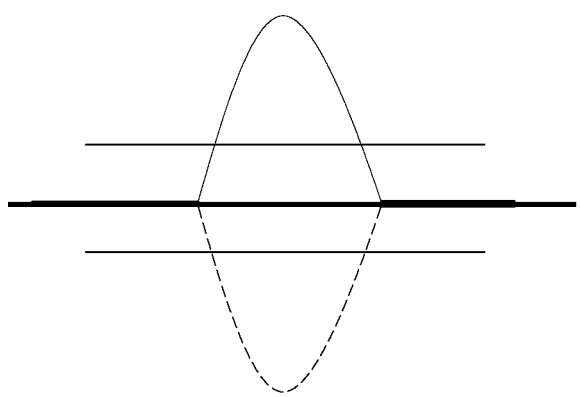

FIGS. 4A and 4B are diagrams illustrating direct current offset calibration.

Universally, by comparing a difference in DC level between both terminals, DC offset calibration of a mechanism for reducing or minimizing the difference is used. This may be used as a method for canceling the offset, but may cause the error in output data in a system utilizing a differential structure.

As illustrated in FIG. 4A, it can be seen that the offset of both terminals is cancelled, but degrees at which both output values are more than the reference voltage of the comparator are different from each other. Both output values are represented by solid and dotted lines.

On the contrary, as illustrated in FIG. 4B, it can be seen that the offset of both terminals is also cancelled, but the degrees at which both output values are more than the reference voltage of the comparator are the same as each other.

Figure 5:
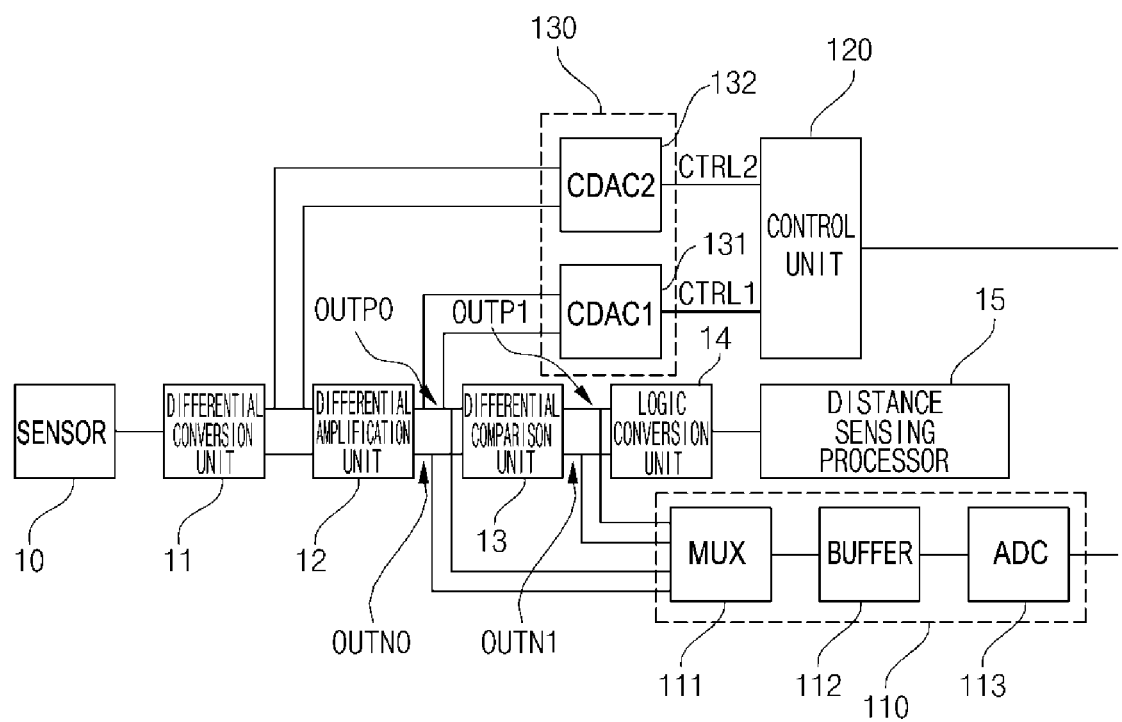
FIG. 5 is a configuration diagram illustrating a configuration of an apparatus for canceling a receiver input offset in a distance sensing system according to an exemplary form of the present disclosure.

FIG. 5 is a configuration diagram illustrating a configuration of an apparatus for canceling a receiver input offset in a distance sensing system according to an exemplary form of the present disclosure.

As illustrated in FIG. 5, the apparatus for canceling a receiver input offset in a distance sensing system according to an exemplary form of the present disclosure includes an output monitoring unit 110, a control unit 120, and a current type digital-analog conversion unit 130.

However, all illustrated components are not required components. The receiver input offset canceling apparatus may be implemented by components which are more than the illustrated components or implemented by components which are less than the illustrated components.

Hereinafter, a detailed configuration and a detailed operation of each of the components of the apparatus for canceling a receiver input offset in a distance sensing system in FIG. 5 will be described.

First, the distance sensing system may be the LIDAR system. The distance sensing system may include a sensor 10, a differential conversion unit 11, a differential amplification unit 12, a differential comparison unit 13, a logic conversion unit 14, and a distance sensing processor 15.

In the distance sensing system, when a photodiode sends pulse type current, the distance sensing system amplifies the pulse to acquire timing information and sense presence or not of an object. Since an amplitude of the output of the photodiode is very small, the amplitude of the output of the photodiode is amplified by a predetermined amount through the differential amplification unit 12 and then, amplified differential output signals OUTP0 and OUTN0 are transferred to the differential comparison unit 13. The differential comparison unit 13 compares the differential amplification signals OUTP0 and OUTN0 with reference voltage and transfers differential comparison signals OUTP1 and OUTN1 to the logic conversion unit 14. In this case, when there is an offset of DC of both output terminals of the differential amplification unit 12, there is a situation in which an amplitude of a pulse which is more than threshold voltage of the differential amplification unit 12 is changed or does not exist.

In order to compensate for the situation, the apparatus for canceling a receiver input offset in a distance sensing system according to an exemplary form of the present disclosure transfers a differential output of the differential amplification unit 12 to the analog-digital converter 113 through a buffer 112. In addition, the receiver input offset canceling apparatus compares a difference of both outputs through the control unit 120. The receiver input offset canceling apparatus may cancel the input offset of the receiver by reducing the difference through the current type digital-analog conversion unit 130. The differential output has a characteristic that the offset occurs by the same absolute value amount based on the common mode voltage. It can be seen that when current of the same amount is added or subtracted, the offset is reduced.

Hereinafter, a detailed configuration and a detailed operation of each of the components of the apparatus for canceling a receiver input offset in FIG. 5 will be described.

The receiver input offset canceling apparatus is to cancel the input offset of the receiver with the differential amplification unit 12 and the differential comparison unit 13 in the distance sensing system.

The output monitoring unit 110 is connected to an output terminal of the differential comparison unit 13 and the output terminal of the differential amplification unit 12, and monitors the differential amplification outputs OUTP0 and OUTN0 of the differential amplification unit 12 and the differential comparison outputs OUTP1 and OUTN1 of the differential comparison unit 13.

As an example, the output monitoring unit 110 may include a multiplexer (MUX) 111, a buffer 112, and an analog-digital converter 113.

The multiplexer 111 is connected to each of the output terminals of the differential comparison unit 13 and the differential amplification unit 12. The multiplexer 111 selects the differential output of the differential comparison unit 13 or the differential output of the differential amplification unit 12 and transfers the selected differential output to the buffer 112. The multiplexer 111 transfers DC values of the differential amplification outputs OUTP0 and OUTN0 and the differential comparison outputs OUTP1 and OUTN1 to the analog-digital converter 113 through the buffer 112 by multiplexer control.

The buffer 112 buffers the differential output transferred from the multiplexer 111.

The analog-digital converter 113 converts the differential output buffered by the buffer 112 by an analog-digital scheme and transfers the differential output to the control unit 120.

The current type digital-analog conversion unit 130 is connected to each of an input terminal of the differential comparison unit 13 and the input terminal of the differential amplification unit 12.

As an example, the current type digital-analog conversion unit 130 may include a first current type digital-analog conversion unit 131 and a second current type digital-analog conversion unit 132.

The first current type digital-analog conversion unit 131 is connected to the input terminal of the differential comparison unit 13. Further, the second current type digital-analog conversion unit 132 is connected to the input terminal of the differential amplification unit 12.

The control unit 120 compares a converted value through the output monitoring unit 110. The control unit 120 reduces the difference of the differential output of the differential comparison unit 13 by controlling the current type digital-analog conversion unit 130 according to a comparison result for the difference of the differential output of the differential comparison unit 13 monitored by the output monitoring unit 110. In addition, the control unit 120 reduces the difference of the differential output of the differential amplification unit 12 by controlling the current type digital-analog conversion unit 130 according to the comparison result for the difference of the differential output of the differential amplification unit 12 monitored by the output monitoring unit 110.

When the difference of the differential output of the differential comparison unit 13 is less than a predetermined minimum offset, the control unit 120 fixes a control bit of the first current type digital-analog converter.

The control unit 120 changes a first control bit for controlling reference current of the first current type digital-analog conversion unit 131 to reduce the difference of the differential output of the differential comparison unit 13.

The control unit 120 may change a second control bit for controlling an amount of current output as the output of the first current type digital-analog conversion unit 131.

For the second current type digital-analog conversion unit 132, the control unit 120 changes a first control bit for controlling reference current of the second current type digital-analog conversion unit 132 to reduce the difference of the differential output of the differential amplification unit 12.

The control unit 120 may change a second control bit for controlling an amount of current output as the output of the second current type digital-analog conversion unit 132. The control unit 120 confirms that the offset is reduced by sweeping each of control values CTRL1 and CTRL2. In addition, the control unit 120 fixes each of the control values CTRL1 and CTRL2 to have a minimum offset.

As such, an offset cancellation order is as follows. The receiver input offset canceling apparatus compares DC voltage through the analog-digital converter 113 of the output monitoring unit 110. In addition, the receiver input offset canceling apparatus reduces or minimizes the offset by controlling the current type digital-analog conversion unit 130. In this case, the size of the offset may vary depending on the gain.

Figure 6A:
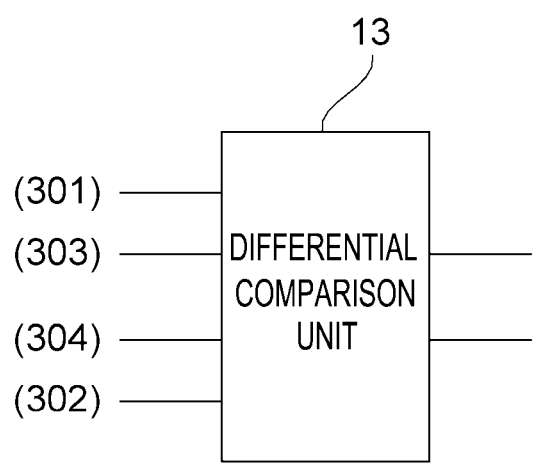
FIGS. 6A and 6B are diagrams illustrating a configuration of a receiver used in an exemplary form of the present disclosure.
Figure 6B:
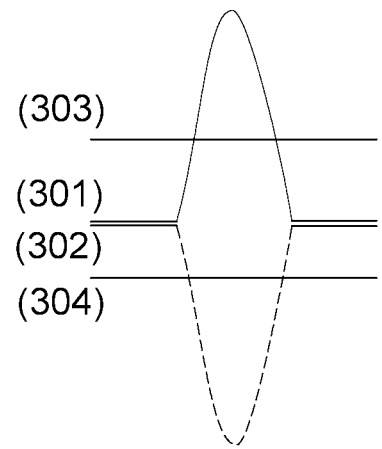

FIGS. 6A and 6B are diagrams illustrating a configuration of a receiver used in an exemplary form of the present disclosure.

In the distance sensing system used in an exemplary form of the present disclosure, the differential comparison unit 13 receives a differential signal.

The distance sensing system receives a single signal and converts the received single signal into the differential signal to accurately determine whether there is a pulse type signal.

The differential comparison unit 13 included in the distance sensing system receives four differential signals as an input as illustrated in FIGS. 6A-6B. Here, reference signals 303 and 304 among four signals are included.

Therefore, a difference in DC level between signal #1 301 and signal #2 302 should be close to 0, of course, and should be close to common mode voltage. Therefore, the difference matches an accurate voltage value by using the analog-digital converter 113.

Figure 7:
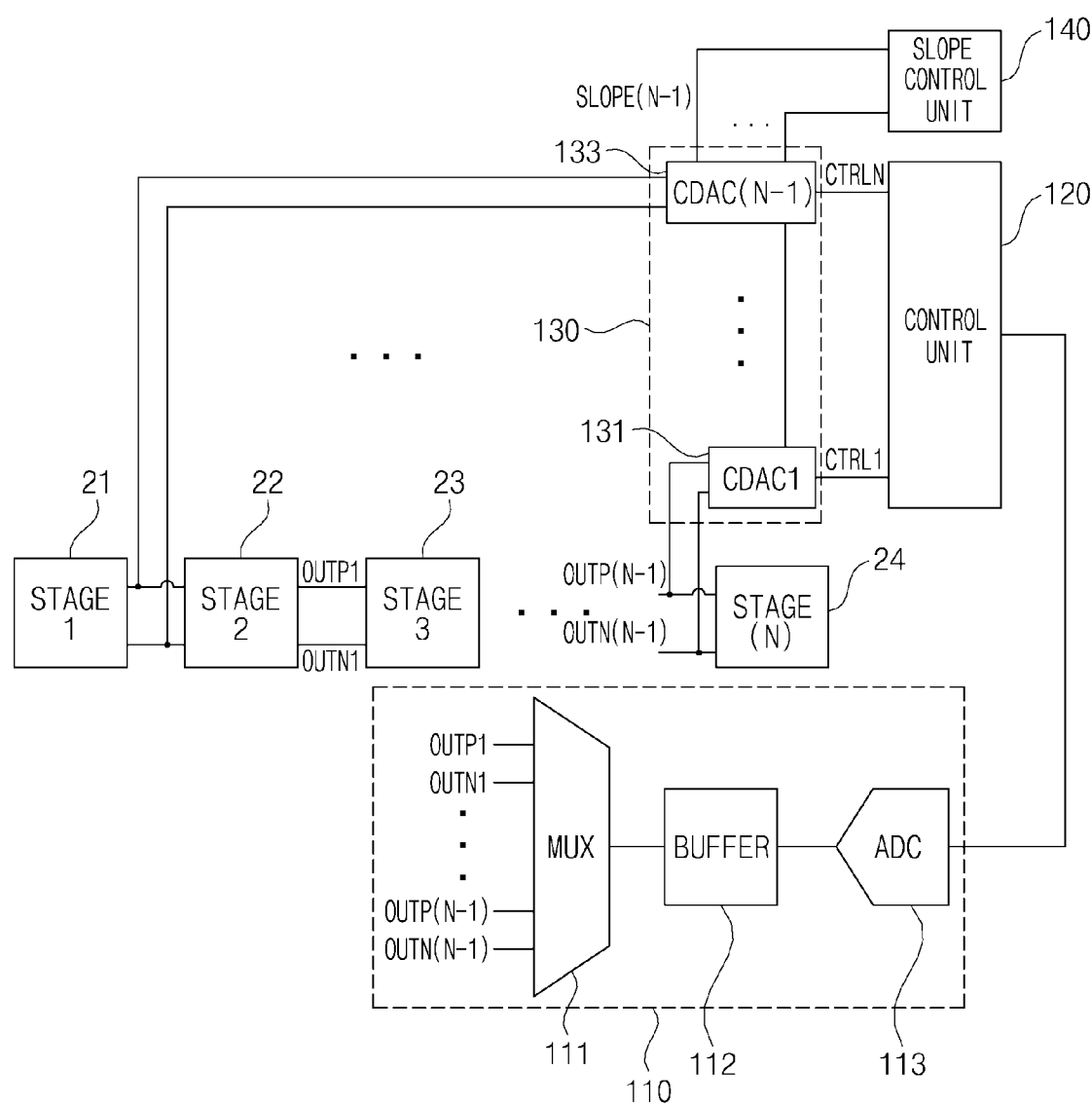
FIG. 7 is a configuration diagram illustrating a configuration of an apparatus for canceling a receiver input offset in a distance sensing system according to another exemplary form of the present disclosure.

FIG. 7 is a configuration diagram illustrating a configuration of an apparatus for canceling a receiver input offset in a distance sensing system according to another exemplary form of the present disclosure.

As illustrated in FIG. 7, the apparatus for canceling a receiver input offset in a distance sensing system according to another exemplary form of the present disclosure includes an output monitoring unit 110, a control unit 120, and a current type digital-analog conversion unit 130. Here, the apparatus for canceling a receiver input offset may further include a slope control unit 140.

However, all illustrated components are not required components. The receiver input offset canceling apparatus may be implemented by components which are more than the illustrated components or implemented by components which are less than the illustrated components.

Hereinafter, a detailed configuration and a detailed operation of each of the components of the apparatus for canceling a receiver input offset in a distance sensing system in FIG. 7 will be described. A configuration difference by comparison with FIG. 5 which is an exemplary form of the present disclosure will be primarily described.

First, the distance sensing system may be constituted by a plurality of stages in order to sense a distance through calculation of a ToF value. The plurality of stages may include STAGE 1, STAGE 2, STAGE 3, . . . , STAGE N.

When there are N stages in the plurality of stages, the receiver input offset canceling apparatus includes N−1 current type digital-analog conversion unit 130. N−1 current type digital-analog conversion units 130 may include current type digital-analog conversion unit 1 (CDAC1) 131, current type digital-analog conversion unit 2 (CDAC2) 132, . . . , current type digital-analog conversion unit N−1 (CDAC (N−1)) 133. When the distance sensing system is constituted by N (N is a natural number) stages 21, 22, 23, . . . , 24, the current type digital-analog conversion unit 130 may include N−1 current type digital-analog conversion units 131, 132, . . . , 133 connected to the input terminals of N−1 stages, respectively. Here, N−1 calibration loops are generated to increase a time desired.

The slope control unit 140 of the receiver input offset canceling apparatus sets a slope from coarse to fine for each current type digital-analog conversion unit.

As an example, the receiver input offset canceling apparatus sets the first current type digital-analog conversion unit (CDAC1) 131 as coarse indicating an increased slope. The slope increases. The receiver input offset canceling apparatus sets the N−1-th current type digital-analog conversion unit (CDAC (N−1)) 133 as fine indicating a decreased slope.

The receiver input offset canceling apparatus performs loop calibrations of a desired number according to an offset amount.

Here, the receiver input offset canceling apparatus first performs offset cancellation of a final stage when the gain exceeds a predetermined level. On the contrary, the receiver input offset canceling apparatus first performs offset cancellation of a first stage when the gain is equal to or lower than the predetermined level.

As such, the receiver input offset canceling apparatus is to cancel the offset and shorten a calibration time for the offset cancellation. To this end, the receiver input offset canceling apparatus performs coarse and fine setting operations of controlling the slope of the current type digital-analog conversion unit 130. A sequence for this is added.

Figure 8:
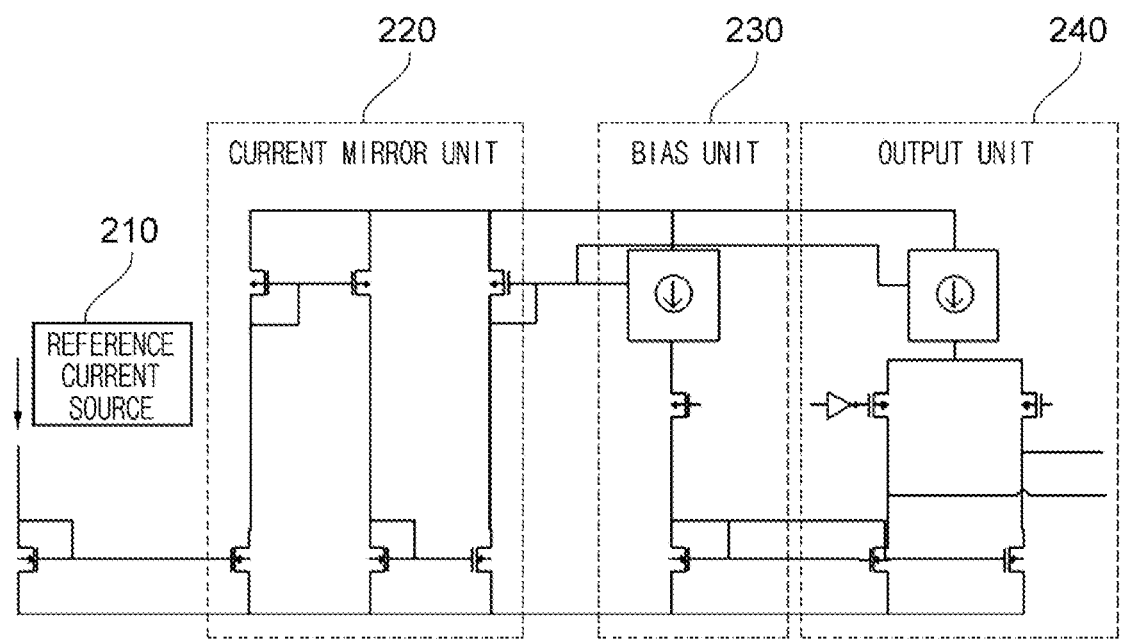
FIG. 8 is a diagram illustrating a configuration of a current type digital-analog converter of an apparatus for canceling a receiver input offset according to an exemplary form of the present disclosure.

FIG. 8 is a diagram illustrating a configuration of a current type digital-analog converter of an apparatus for canceling a receiver input offset according to an exemplary form of the present disclosure.

As illustrated in FIG. 8, the current type digital-analog conversion unit (CDAC) used in an exemplary form of the present disclosure includes a reference current source 210, a current mirror unit 220, a bias unit 230, and an output unit 240 as components of the current type digital-analog conversion unit 130. However, all illustrated components are not required components. The current type digital-analog conversion unit may be implemented by components which are more than the illustrated components or implemented by components which are less than the illustrated components.

Hereinafter, a detailed configuration and a detailed operation of each of the components of the current type digital-analog conversion unit of FIG. 8 will be described.

The reference current source 210 makes predetermined reference current flow on a corresponding circuit.

The current mirror unit 220 transfers the reference current to the bias unit 230 by mirroring the reference current which flows from the reference current source 210.

The bias unit 230 generates the same bias as a current source circuit of the output unit 240.

The output unit 240 outputs the differential output according to the control of the control unit 120. In this case, absolute value amounts of both outputs the same as each other and signs of both outputs are opposite to each other.

Figure 9:
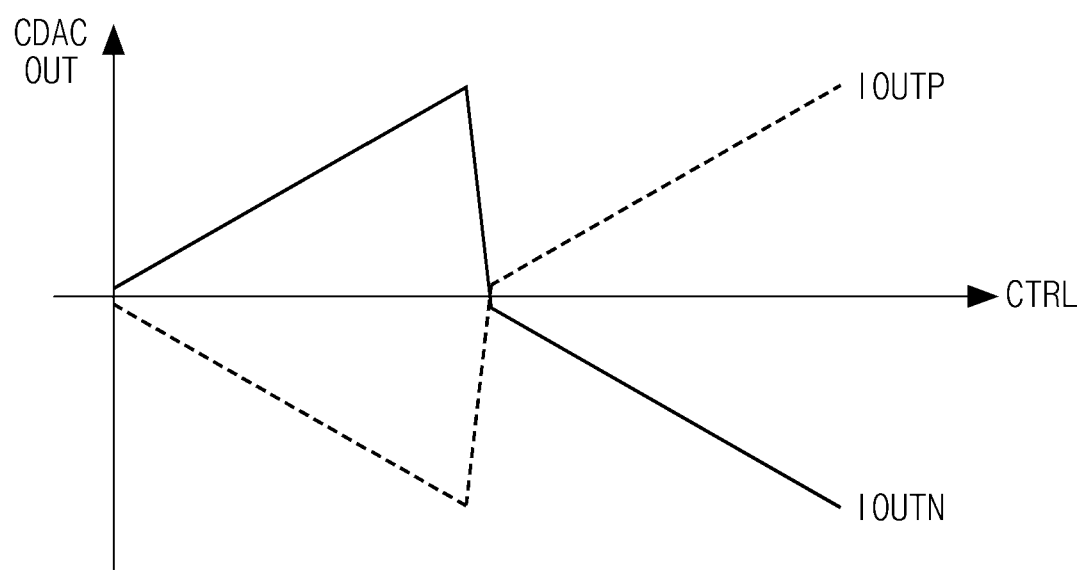
FIG. 9 is a diagram illustrating a differential output of a current type digital-analog converter of an apparatus for canceling a receiver input offset according to an exemplary form of the present disclosure.

FIG. 9 is a diagram illustrating a differential output of a current type digital-analog converter of an apparatus for canceling a receiver input offset according to an exemplary form of the present disclosure.

A differential output CADC OUT of the current type digital-analog conversion unit depending on a control (CTRL) value for each of differential current outputs IOUTP and IOUTN is illustrated in FIG. 9.

Figure 10:
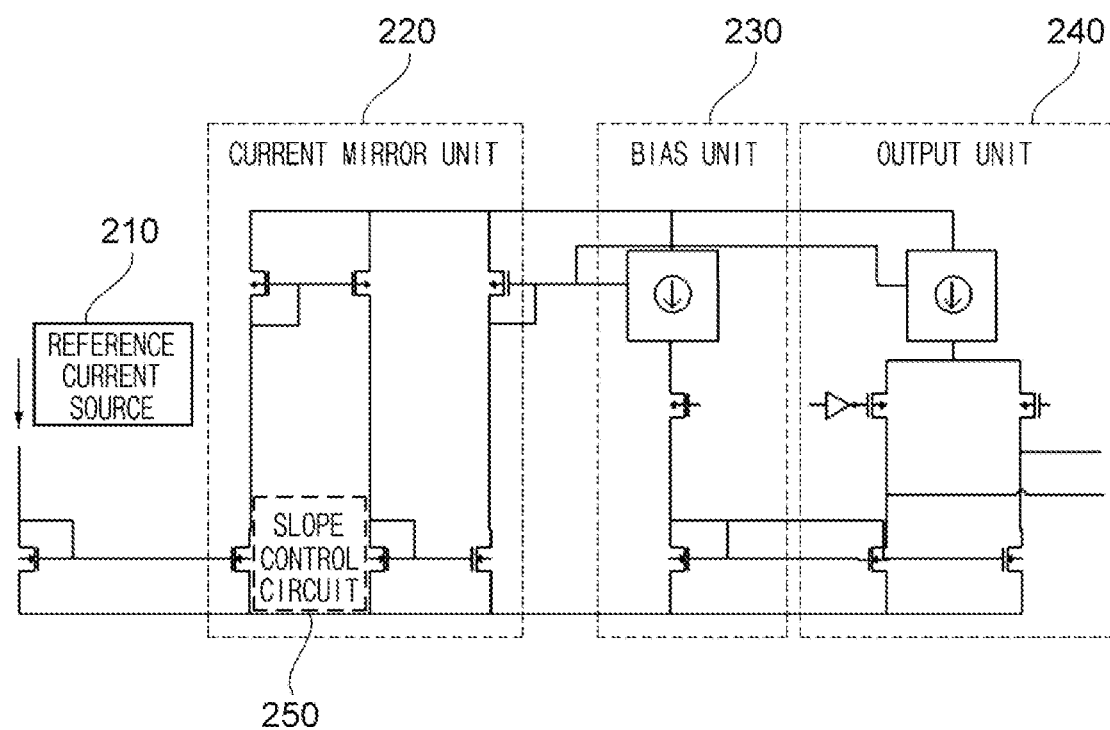
FIG. 10 is a diagram illustrating another configuration of a current type digital-analog converter of an apparatus for canceling a receiver input offset according to an exemplary form of the present disclosure.

FIG. 10 is a diagram illustrating another configuration of a current type digital-analog converter of an apparatus for canceling a receiver input offset according to an exemplary form of the present disclosure.

As illustrated in FIG. 10, the current type digital-analog conversion unit (CDAC) used in an exemplary form of the present disclosure may further include a slope control circuit 250 unlike FIG. 8.

Figure 11:
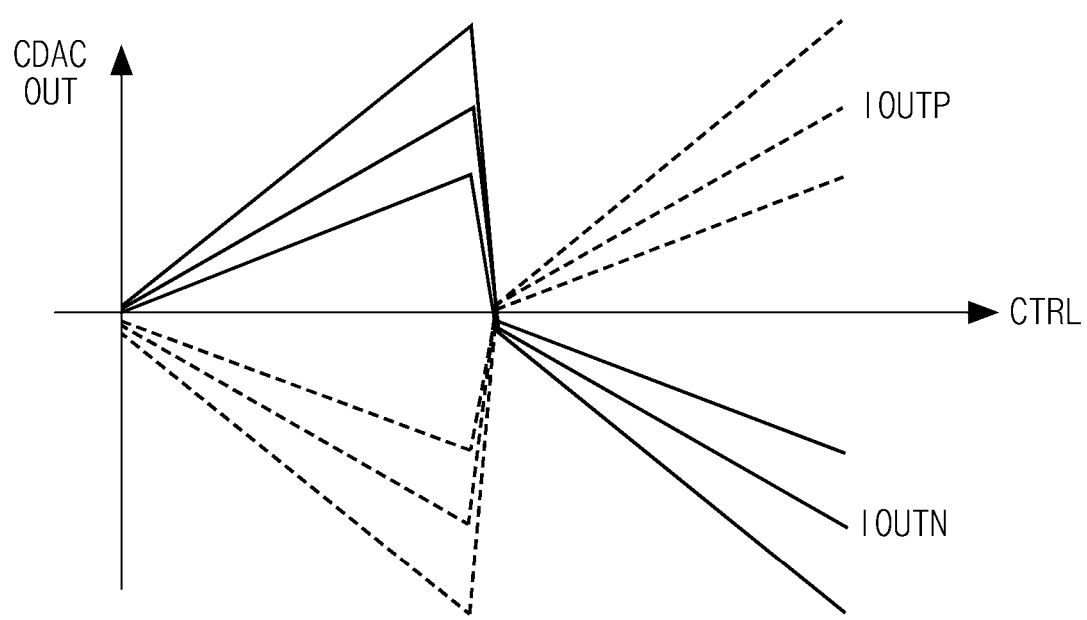
FIG. 11 is a diagram illustrating another differential output of a current type digital-analog converter of an apparatus for canceling a receiver input offset according to an exemplary form of the present disclosure.

FIG. 11 is a diagram illustrating another differential output of a current type digital-analog converter of an apparatus for canceling a receiver input offset according to an exemplary form of the present disclosure.

The other differential output CADC OUT of the current type digital-analog conversion unit depending on a control (CTRL) value for each of differential current outputs IOUTP and IOUTN is illustrated in FIG. 11. Different differential outputs in which slopes are controlled for each of differential current outputs IOUTP and IOUTN, respectively by the slope control circuit 250 are illustrated in FIG. 11.

As such, the receiver input offset canceling apparatus enables changing a maximum range of a current output IOUT depending on gain setting. To this end, the receiver input offset canceling apparatus performs a control of the reference current of the current type digital-analog conversion unit (CDAC).

Figure 12:
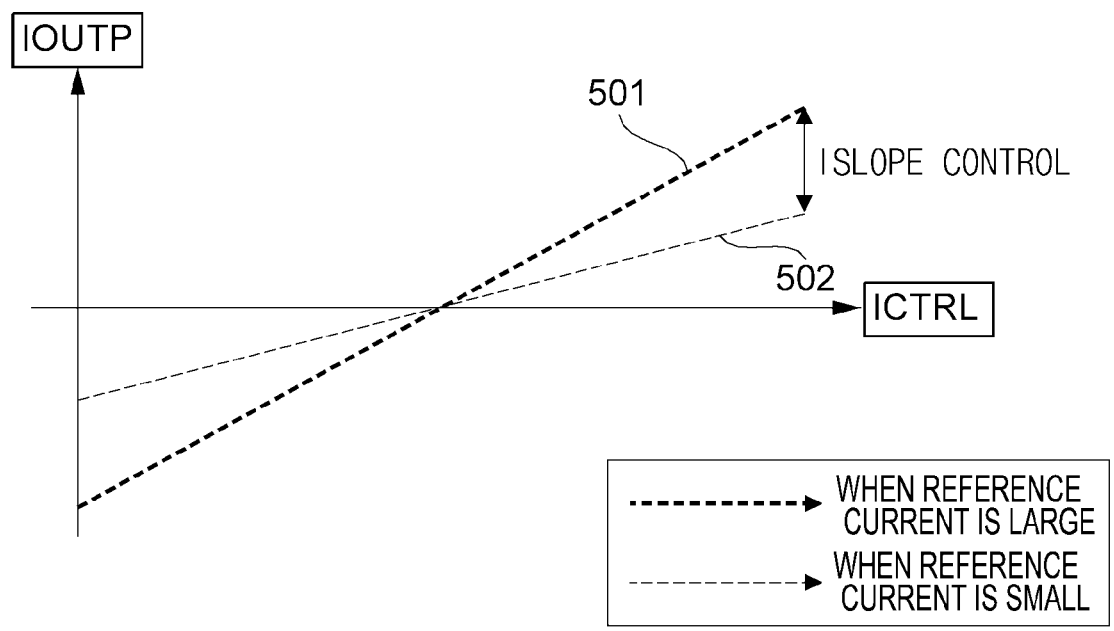
FIG. 12 is a diagram illustrating a control operation of a first control bit used in an exemplary form of the present disclosure.

FIG. 12 is a diagram illustrating a control operation of a first control bit used in an exemplary form of the present disclosure.

As illustrated in FIG. 12, the receiver input offset canceling apparatus according to an exemplary form of the present disclosure controls a first control bit of the current type digital-analog conversion unit.

Two types of control bits are allocated to the current type digital-analog conversion unit. That is, two types of control bits include a first control bit and a second control bit.

The first control bit controls the reference current. In FIG. 122, current slope ISLOPE is illustrated for a case where the reference current is large (501) and a case where the reference current is small (502).

In FIG. 12, a reference current branch is simply expressed as one, but the reference current branch is connected to multiple branches to control the current amount by the first control bit.

In respect to the need thereof, an amount in which an output DC offset is widened may vary depending on the gain and the size may be short even by controlling allocated ICTRL. Therefore, the receiver input offset canceling apparatus decreases or increases an output range which may be output by the current digital-analog conversion unit to more precisely perform DC-offset cancellation (DCOC).

Figure 13:
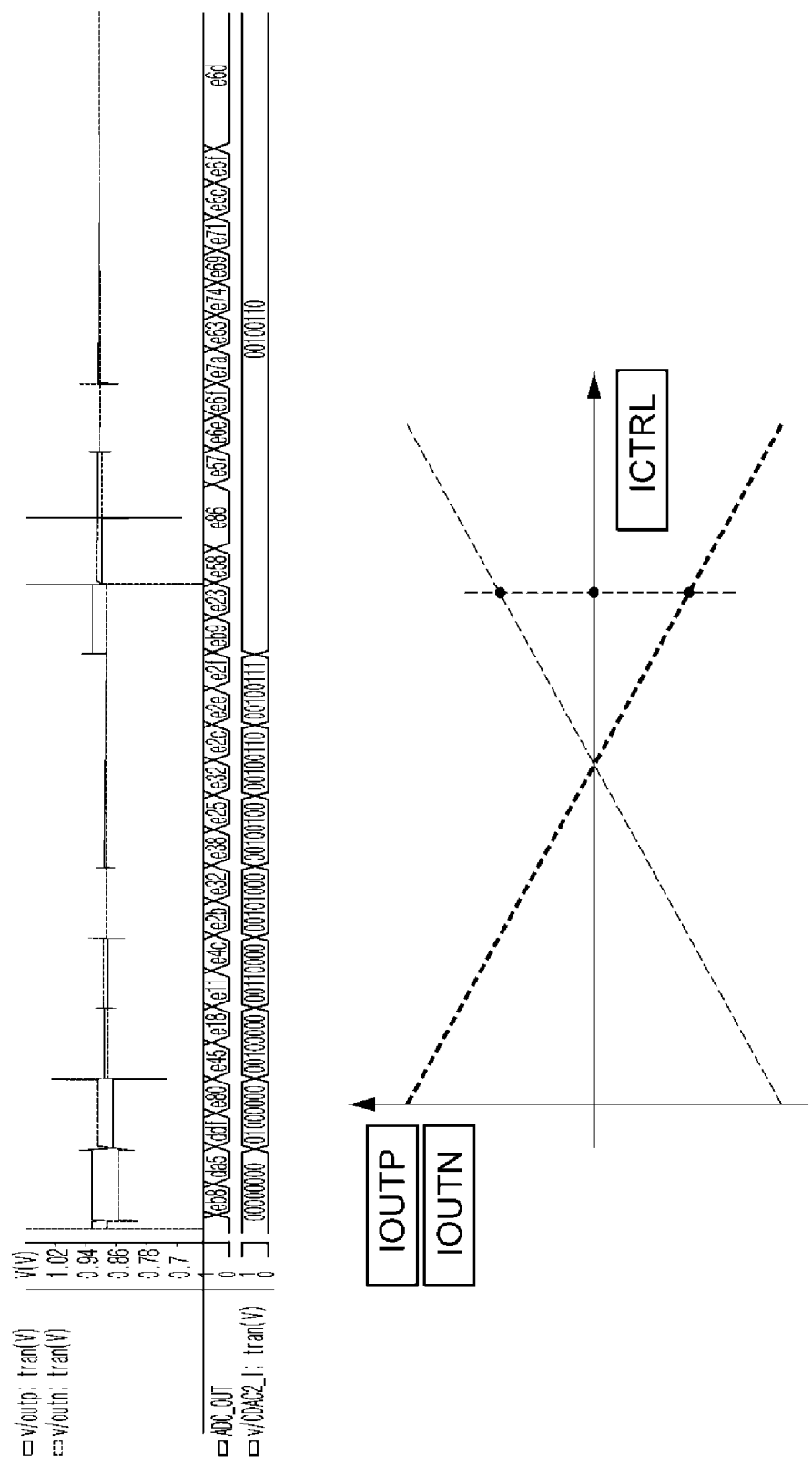
FIG. 13 is a diagram illustrating a control operation of a second control bit used in an exemplary form of the present disclosure.

FIG. 13 is a diagram illustrating a control operation of a second control bit used in an exemplary form of the present disclosure.

As illustrated in FIG. 13, the receiver input offset canceling apparatus according to an exemplary form of the present disclosure controls the second control bit of the current type digital-analog conversion unit.

The second control bit is displayed by ICTRL in FIG. 13 and controls an amount of current output as the output.

The analog-digital converter 113 of the monitoring unit monitors values of both output terminals OUTP and OUTN of the differential amplification unit 12. Thereafter, the control unit 120 searches an ICTRL value in which the minimum offset exists by sweeping the second control bit ICTRL.

Meanwhile, the receiver input offset canceling apparatus in the distance sensing system according to an exemplary form of the present disclosure may be applied in association with LIDAR signal processing.

In performing the LIDAR signal processing, a largest feature is that an input is current. Accordingly, the corresponding circuit has a feature that the offset is reduced by controlling the current. Therefore, the receiver input offset canceling apparatus may increase accuracy in distance sensing using the LIDAR.

Figure 14:
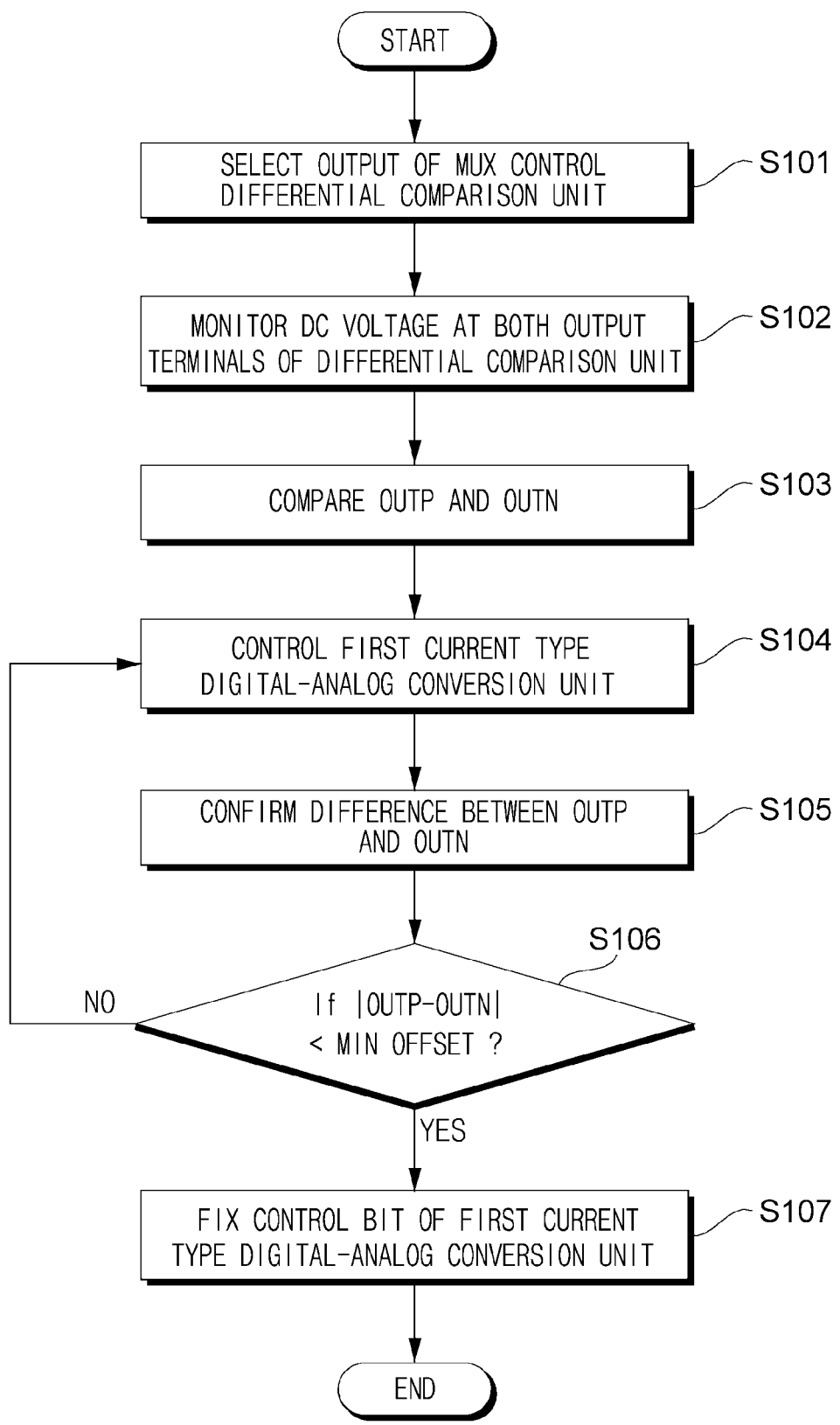
FIGS. 14 and 15 are flowcharts for a method for canceling a receiver input offset in a distance sensing system according to an exemplary form of the present disclosure.
Figure 15:
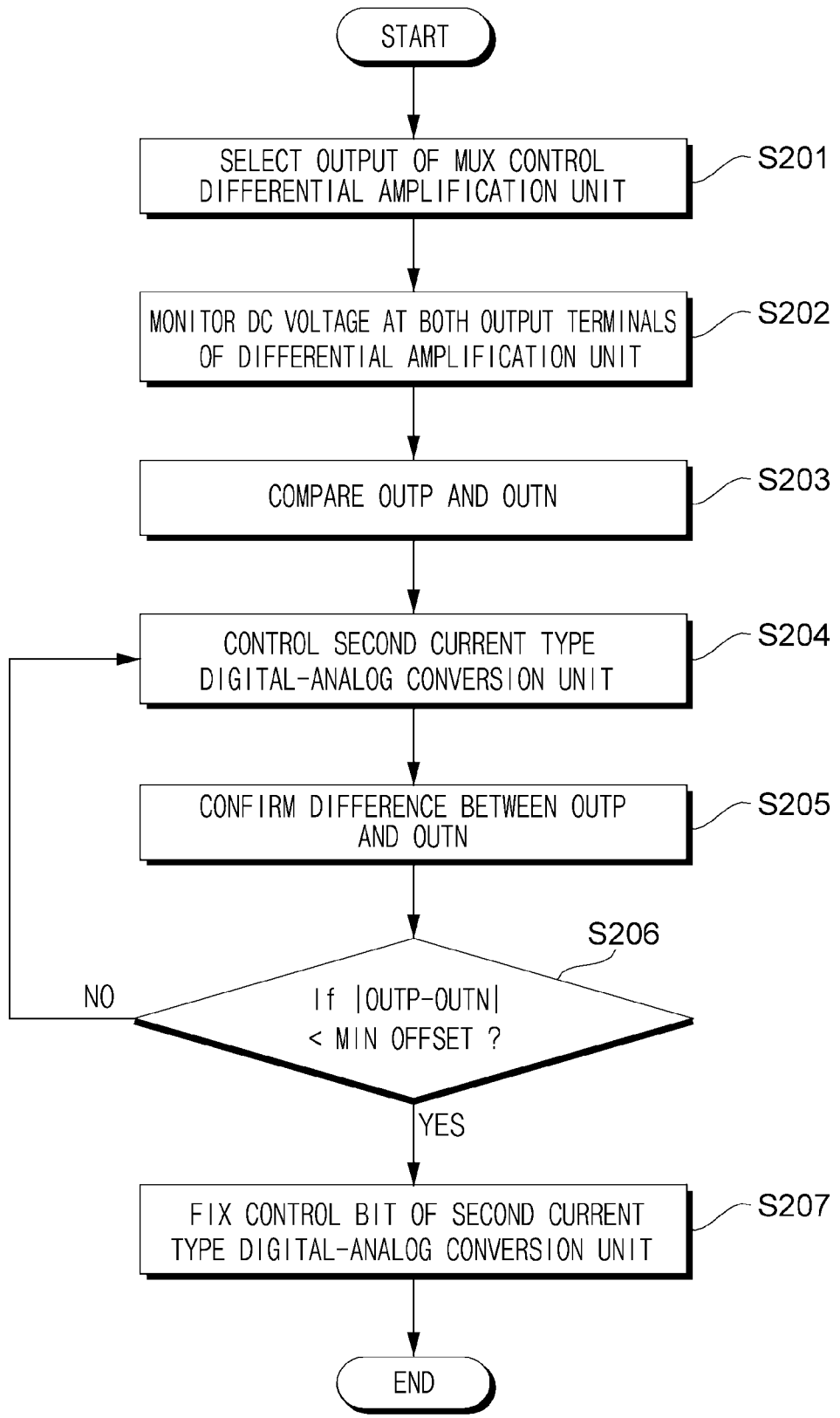

FIGS. 14 and 15 are flowcharts for a method for canceling a receiver input offset in a distance sensing system according to an exemplary form of the present disclosure.

Overall flowcharts are illustrated in FIG. 7 illustrating the offset calibration of the differential comparison unit 13 and in FIG. 8 illustrating the offset calibration of the differential amplification unit 12. A reason for first performing the offset calibration of the differential comparison unit 13 is that an offset control point of the differential comparison unit 13 and an offset sensing point of the differential amplification unit 12 are the same as each other.

As illustrated in FIG. 14, in step S101, the receiver input offset canceling apparatus controls the multiplexer 111 of the output monitoring unit 110. The receiver input offset canceling apparatus selects the output of the differential comparison unit 13.

In step S102, the receiver input offset canceling apparatus monitors DC voltage at both output terminals of the differential comparison unit 13.

In step S103, the receiver input offset canceling apparatus compares OUTP and OUTN which are the DC voltage at both output terminals of the differential comparison unit 13.

In step S104, the receiver input offset canceling apparatus controls the first current type digital-analog conversion unit 131.

In step S105, the receiver input offset canceling apparatus confirms a difference between OUTP and OUTN which are the DC voltage at both output terminals of the differential comparison unit 13.

In step S106, the receiver input offset canceling apparatus confirms whether the difference between OUTP and OUTN which are the DC voltage at both output terminals of the differential comparison unit 13 is less than the minimum offset (|OUTP−OUTN|<min offset).

In step S107, the receiver input offset canceling apparatus fixes of the control bit of the first current type digital-analog conversion unit 131 when the difference between OUTP and OUTN which are the DC voltage at both output terminals of the differential comparison unit 13 is less than the minimum offset. On the contrary, the receiver input offset canceling apparatus performs step S104 of controlling the first current type digital-analog conversion unit 131 again when the difference between OUTP and OUTN which are the DC voltage at both output terminals of the differential comparison unit 13 is equal to or more than the minimum offset.

As such, the receiver input offset canceling apparatus monitors the differential output of the differential comparison unit 13 and controls the first current type digital-analog conversion unit 131 connected to the input of the differential comparison unit 13 according to a comparison result for the difference of the monitored differential output of the differential comparison unit 13 to reduce the difference of the differential output of the differential comparison unit 13.

Meanwhile, as illustrated in FIG. 15, in step S201, the receiver input offset canceling apparatus controls the multiplexer 111 of the output monitoring unit 110. The receiver input offset canceling apparatus selects the output of the differential amplification unit 12.

In step S202, the receiver input offset canceling apparatus monitors the DC voltage at both output terminals of the differential amplification unit 12.

In step S203, the receiver input offset canceling apparatus compares OUTP and OUTN which are the DC voltage at both output terminals of the differential amplification unit 12.

In step S204, the receiver input offset canceling apparatus controls the second current type digital-analog conversion unit 132.

In step S205, the receiver input offset canceling apparatus confirms a difference between OUTP and OUTN which are the DC voltage at both output terminals of the differential amplification unit 12.

In step S206, the receiver input offset canceling apparatus confirms whether the difference between OUTP and OUTN which are the DC voltage at both output terminals of the differential amplification unit 12 is less than the minimum offset (|OUTP−OUTN|<min offset).

In step S207, the receiver input offset canceling apparatus fixes of the control bit of the second current type digital-analog conversion unit 132 when the difference between OUTP and OUTN which are the DC voltage at both output terminals of the differential amplification unit 12 is less than the minimum offset. On the contrary, the receiver input offset canceling apparatus performs step S204 of controlling the second current type digital-analog conversion unit 132 again when the difference between OUTP and OUTN which are the DC voltage at both output terminals of the differential amplification unit 12 is equal to or more than the minimum offset.

As such, the receiver input offset canceling apparatus monitors the differential output of the differential amplification unit 12 and controls the second current type digital-analog conversion unit 132 connected to the input of the differential amplification unit 12 according to the comparison result for the difference of the monitored differential output of the differential amplification unit 12 to reduce the difference of the differential output of the differential amplification unit 12.

Figure 16:
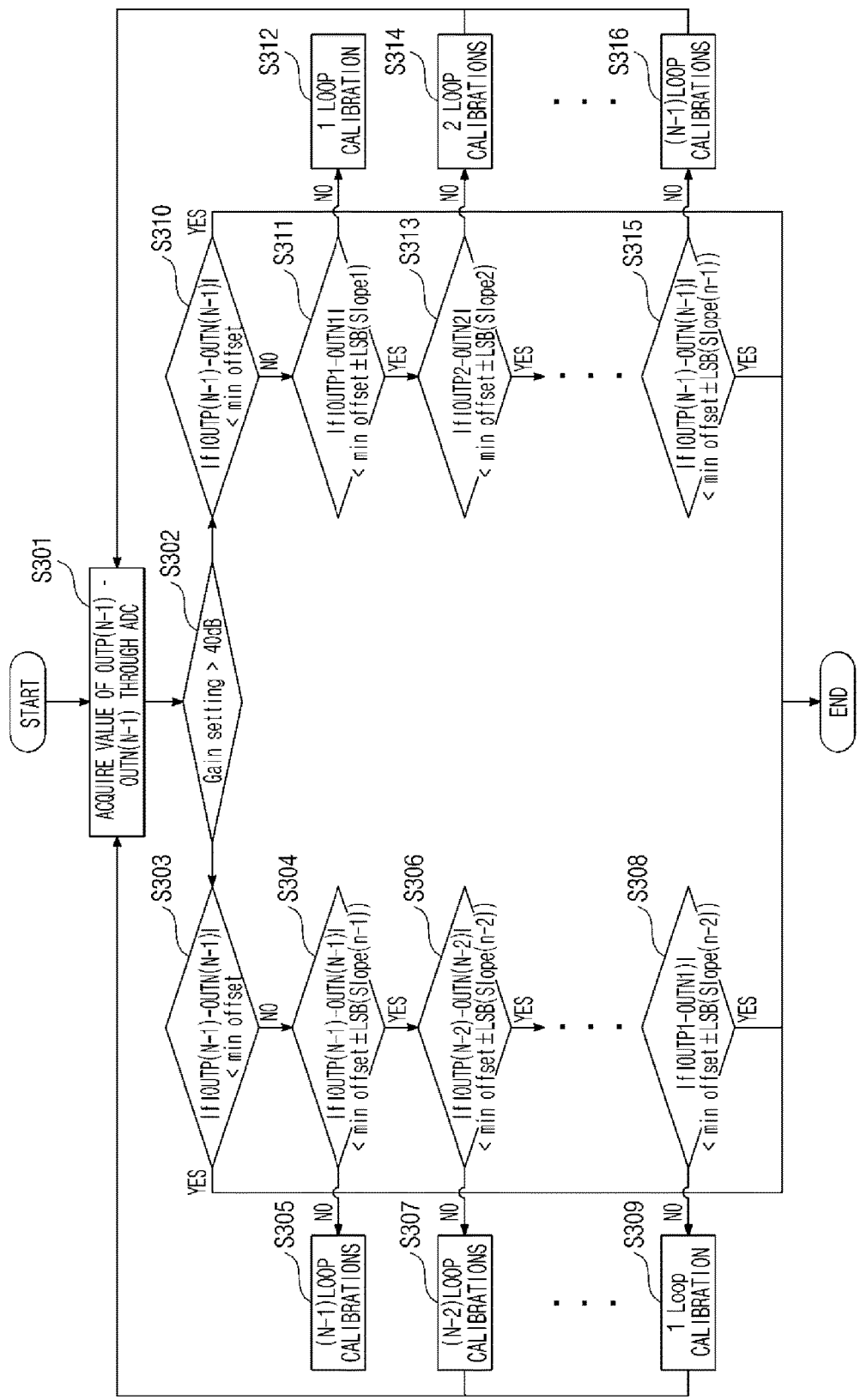
FIG. 16 is a flowchart for a method for canceling a receiver input offset in a distance sensing system according to another exemplary form of the present disclosure.

FIG. 16 is a flowchart for a method for canceling a receiver input offset in a distance sensing system according to another exemplary form of the present disclosure.

In step S301, the receiver input offset canceling apparatus acquires a value of OUTP(N−1)−OUTN(N−1) through the output monitoring unit 110.

In step S302, the receiver input offset canceling apparatus confirms whether gain setting exceeds a predetermined gain value (e.g., 40 dB).

In step S303, the receiver input offset canceling apparatus confirms whether a value of |OUTP(N−1)−OUTN(N−1)| is less than the minimum offset when the gain setting exceeds the predetermined gain value (e.g., 40 dB). The receiver input offset canceling apparatus terminates an operation when the value of |OUTP(N−1)−OUTN(N−1)| is less than the minimum offset.

In step S304, when the value of |OUTP(N−1)−OUTN(N−1)| is not less than the min offset, the receiver input offset canceling apparatus confirms whether the value of |OUTP(N−1)−OUTN(N−1)| is less than min offset±LSB(Slope(n−1)).

In step S305, when the value of |OUTP(N−1)−OUTN(N−1)| is not less than min offset±LSB(Slope(n−1)), the receiver input offset canceling apparatus performs (N−1) loop calibrations.

In step S306, when the value of |OUTP(N−1)−OUTN(N−1)| is less than min offset LSB(Slope(n−1)), the receiver input offset canceling apparatus confirms whether the value of |OUTP(N−1)−OUTN(N−1)| is less than min offset±LSB (Slope(n−2)).

In step S307, when the value of |OUTP(N−1)−OUTN(N−1)| is not less than min offset±LSB(Slope(n−2)), the receiver input offset canceling apparatus performs (N−2) loop calibrations.

Thereafter, the receiver input offset canceling apparatus performs (N−2) to 2 loop calibrations while reducing an n value of ±LSB(Slope(n)) from n−2 to 2.

In step S308, when the value of |OUTP2−OUTN2| is less than min offset±LSB(Slope2), the receiver input offset canceling apparatus confirms whether the value of |OUTP1−OUTN1| is less than min offset±LSB(Slope1).

In step S309, when the value of |OUTP1−OUTN1| is not less than min offset±LSB(Slope1), the receiver input offset canceling apparatus performs 1 loop calibration. When the value of |OUTP1−OUTN1| is less than min offset±LSB (Slope1), the receiver input offset canceling apparatus terminates the operation.

Meanwhile, in step S310, the receiver input offset canceling apparatus confirms whether the value of |OUTP(N−1)−OUTN(N−1)| is less than the minimum offset when the gain setting does not exceed the predetermined gain value (e.g., 40 dB). The receiver input offset canceling apparatus terminates an operation when the value of |OUTP(N−1)−OUTN(N−1)| is less than the minimum offset.

In step S311, when the value of |OUTP(N−1)−OUTN(N−1)| is not less than the minimum offset, the receiver input offset canceling apparatus confirms whether the value of |OUTP1−OUTN1| is less than min offset±LSB(Slope1).

In step S312, when the value of |OUTP1−OUTN1| is not less than min offset±LSB(Slope1), the receiver input offset canceling apparatus performs 1 loop calibration.

In step S313, when the value of |OUTP1−OUTN1| is less than min offset±LSB(Slope1), the receiver input offset canceling apparatus confirms whether the value of |OUTP2 OUTN2| is less than min offset±LSB(Slope2).

In step S314, when the value of |OUTP2−OUTN2| is not less than min offset±LSB(Slope2), the receiver input offset canceling apparatus performs 2 loop calibrations.

Thereafter, the receiver input offset canceling apparatus performs 2 to (N−2) loop calibrations while increasing the n value of ±LSB(Slope(n)) from 2 to n−2.

In step S315, when the value of |OUTP(N−2)−OUTN(N−2)| is less than min offset LSB(Slope(n−2)), the receiver input offset canceling apparatus confirms whether the value of |OUTP(N−1)−OUTN(N−1)| is less than min offset±LSB(Slope(n−1)).

In step S316, when the value of |OUTP(N−1)−OUTN(N−1)| is not less than min offset±LSB(Slope(n−1)), the receiver input offset canceling apparatus performs (N−1) loop calibrations. When the value of |OUTP(N−1)−OUTN(N−1)| is less than min offset±LSB(Slope(n−1)), the receiver input offset canceling apparatus terminates the operation.

As such, according to exemplary forms of the present disclosure, significant technical improvement may be enabled in distance sensing of a LIDAR semiconductor. In sensing a distance, a significant gain is desired for signal processing by receiving a current signal as an input. When exemplary forms of the present disclosure are applied, a range of a gain which may be utilized in the distance sensing system is widened. This may become one of methods for increasing the distance of object sensing. Further, according to exemplary forms of the present disclosure, an error of data delivered to a logic through a comparator is reduced to increase accuracy of the data.

Meanwhile, the forms according to the present disclosure may be implemented in the form of program instructions that can be executed by computers, and may be recorded in computer readable media. The computer readable media may include program instructions, a data file, a data structure, or a combination thereof. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

As described above, the exemplary forms have been described and illustrated in the drawings and the specification. The exemplary forms were chosen and described in order to explain certain principles of the present disclosure and their practical application, to thereby enable others skilled in the art to make and utilize various exemplary forms of the present disclosure, as well as various alternatives and modifications thereof. As is evident from the foregoing description, certain aspects of the present disclosure are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the present disclosure are deemed to be covered by the present disclosure which is limited only by the claims which follow.

What is claimed is:

1. An apparatus for canceling an input offset of a receiver including a differential amplification unit and a differential comparison unit in a distance sensing system, the apparatus comprising:
   an output monitoring unit configured to selectively monitor differential outputs each of both output terminals of the differential comparison unit and both output terminals of the differential amplification unit;
   a current type digital-analog conversion unit connected to each of an input terminal of the differential comparison unit and an input terminal of the differential amplification unit; and
   a control unit configured to: control the current type digital-analog conversion unit to reduce a difference in differential output of the differential comparison unit based on a comparison result for the difference of the monitored both output terminals of the differential comparison unit, and control the current type digital-analog conversion unit to reduce the difference in differential output of the differential amplification unit based on the comparison result for the difference of the monitored both output terminals of the differential amplification unit.

2. The apparatus of claim 1, wherein the output monitoring unit includes:
   a multiplexer connected to each of an output terminal of the differential comparison unit and the output terminal of the differential amplification unit and configured to select and transfer the differential output of the differential comparison unit or the differential output of the differential amplification unit,
   a buffer configured to buffer the transferred differential output, and
   an analog-digital converter configured to convert the buffered differential output by an analog-digital scheme.

3. The apparatus of claim 1, wherein the current type digital-analog conversion unit includes:
a first current type digital-analog conversion unit connected to the input terminal of the differential comparison unit, and
a second current type digital-analog conversion unit connected to the input terminal of the differential amplification unit.

4. The apparatus of claim 3, wherein when the difference of the differential output of the differential comparison unit is less than a predetermined minimum offset, the control unit is configured to fix a control bit of the first current type digital-analog converter.

5. The apparatus of claim 3, wherein the control unit is configured to change a first control bit for controlling a reference current of the first current type digital-analog conversion unit to reduce the difference of the differential output of the differential comparison unit.

6. The apparatus of claim 3, wherein the control unit is configured to change a second control bit for controlling an amount of current output as an output of the first current type digital-analog conversion unit.

7. The apparatus of claim 3, wherein the control unit is configured to change a first control bit for controlling a reference current of the second current type digital-analog conversion unit to reduce the difference of the differential output of the differential amplification unit.

8. The apparatus of claim 3, wherein the control unit is configured to change a second control bit for controlling an amount of current output as an output of the second current type digital-analog conversion unit.

9. The apparatus of claim 1, further comprising:
a slope control unit configured to set a slope from coarse to fine for each current type digital-analog conversion unit.

10. A method for canceling an input offset of a receiver including a differential amplification unit and a differential comparison unit in a distance sensing system, the method comprising:
monitoring, by an output monitoring unit, a differential output each of both output terminals of the differential comparison unit;
controlling, by a control unit, a first current type digital-analog conversion unit connected to an input of the differential comparison unit to reduce a difference in differential output of the differential comparison unit based on a comparison result for the difference of the monitored both output terminals of the differential comparison unit;
monitoring, by the output monitoring unit, the differential output each of both output terminals of the differential amplification unit; and
controlling, by the control unit, a second current type digital-analog conversion unit connected to the input of the differential amplification unit to reduce the difference in differential output of the differential amplification unit based on the comparison result for the difference of the monitored both output terminals of the differential amplification unit.

11. The method of claim 10, wherein monitoring the differential output of the differential comparison unit includes:
selecting and transferring the differential output of the differential comparison unit,
buffering the transferred differential output, and
converting the buffered differential output by an analog-digital scheme.

12. The method of claim 10, wherein monitoring the differential output of the differential amplification unit includes:
selecting and transferring the differential output of the differential amplification unit,
buffering the transferred differential output, and
converting the buffered differential output by an analog-digital scheme.

13. The method of claim 12, further comprising:
when the difference of the differential output of the differential comparison unit is less than a predetermined minimum offset, fixing a control bit of the first current type digital-analog converter.

14. The method of claim 12, wherein in reducing the difference of the differential output of the differential comparison unit, a first control bit for controlling reference current of the first current type digital-analog conversion unit is changed to reduce the difference of the differential output of the differential comparison unit.

15. The method of claim 12, wherein in reducing the difference of the differential output of the differential comparison unit, a second control bit for controlling an amount of current output as an output of the first current type digital-analog conversion unit is changed.

16. The method of claim 12, wherein in reducing the difference of the differential output of the differential amplification unit, a first control bit for controlling reference current of the second current type digital-analog conversion unit is changed to reduce the difference of the differential output of the differential amplification unit.

17. The method of claim 12, wherein in reducing the difference of the differential output of the differential amplification unit, a second control bit for controlling an amount of current output as an output of the second current type digital-analog conversion unit is changed.

18. The method of claim 10, further comprising:
setting a slope from coarse to fine for each current type digital-analog conversion unit.

* * * * *